United States Patent [19]

Sakuma

[11] Patent Number: 5,656,821
[45] Date of Patent: Aug. 12, 1997

[54] QUANTUM SEMICONDUCTOR DEVICE WITH TRIANGULAR ETCH PIT

[75] Inventor: Yoshiki Sakuma, Kawasaki, Japan

[73] Assignee: Fujitsu Limited, Kawasaki, Japan

[21] Appl. No.: 568,124

[22] Filed: Dec. 6, 1995

[30] Foreign Application Priority Data

Mar. 9, 1995 [JP] Japan ................... 7-049534

[51] Int. Cl.$^6$ .................. H01L 29/06; H01L 31/0328; H01L 31/0336
[52] U.S. Cl. .................. 257/14; 257/15; 257/17; 257/22; 257/627; 372/45
[58] Field of Search .................. 257/17, 22, 14, 257/15, 183, 627; 372/44, 45

[56] References Cited

U.S. PATENT DOCUMENTS

| 5,313,484 | 5/1994 | Arimoto | 372/46 |
| 5,518,955 | 5/1996 | Goto et al. | 437/133 |

OTHER PUBLICATIONS

Petroff, P.M. et al., *Appl. Phys. Lett.* 41(7), 1 Oct. 1982, pp. 635,638.
Temkin, H. et al., *Appl. Phys. Lett.* 50(7), 16 Feb. 1987, pp. 413–415.
Asai, H., et al., *Appl. Phys. Lett.* 51(19), 9 Nov. 1987, pp. 1518–1520.
Fukui et al., *Appl. Phys. Lett.* 58(18), 6 May 1991, pp. 2018–2020.
Kapon et al., *Appl. Phys. Lett.* 50(6), 9 Feb. 1987, pp. 347–349.

*Primary Examiner*—William Mintel
*Attorney, Agent, or Firm*—Armstrong, Westerman, Hattori, McLeland, & Naughton

[57] ABSTRACT

A semiconductor device is provided, including a semiconductor substrate of zinc blend structure, defined by a principal surface substantially coinciding to a {111}A-oriented crystal surface; an etch pit of the shape of a triangular pyramid, formed on the principal surface of the substrate, the etch pit being defined by side walls merging at an apex of said triangular pyramid, each two of the side walls merging at a valley of the triangular pyramid; and an active part formed on the etch pit; wherein the active part includes a quantum well layer having a first bandgap and provided along the side walls of the etch pit, and a pair of barrier layers having a second, larger bandgap and provided so as to sandwich the quantum well layer. According to the present invention, the quantum semiconductor device includes a quantum box at the apex of the triangular pyramid and quantum wires at the three valleys of the triangular pyramid, in addition to the one-dimensionally confined quantum wells formed by the quantum well layer in correspondence to each of the side walls of the triangular pyramid. By using the quantum box, quantum wires or quantum wells, the device of the present invention can perform various functions.

8 Claims, 6 Drawing Sheets

QUANTUM SEMICONDUCTOR DEVICE WITH TRIANGULAR ETCH PIT

BACKGROUND OF THE INVENTION

The present invention generally relates to semiconductor devices and more particularly to a quantum semiconductor device formed on a generally tetrahedral etch pit that in turn is formed on a substrate having zinc blende structure such as InP or GaAs, as well as to the fabrication process thereof.

Electron devices used currently are mainly constructed upon a silicon substrate. A typical example is a DRAM (dynamic random access memory). In the field of DRAMs, intensive efforts are in progress for increasing the integration density. By now, an integration density of 256 Mbits is achieved, and it is expected that the integration density would reach 1 Gbits by the year 2000.

On the other hand, the prospect of the devices after the integration density of 1 Gbits reached is not clear yet. There is a concern that the operational principle of current MOS-FETs may not be applicable in such extremely fine devices due to the wave nature of the carriers.

On the other hand, there are proposals for entirely new electron devices that operate based upon quantum effect. Such quantum semiconductor devices use quantum boxes (three-dimensionally confined quantum wells), quantum wires (two-dimensionally confined quantum wells) or one-dimensionally confined, ordinary quantum wells for the active part of the device. Particularly, the quantum devices are studied intensively in relation to the group III–V compound semiconductor devices.

Conventionally, however, such studies of quantum devices are mainly limited to conceptual studies directed to the feasibility of the device or theoretical aspects thereof, and the fabrication of actual quantum devices that include a uniform arrangement of quantum boxes has been neglected somewhat.

Currently, the only quantum device that can be fabricated with reliability is the one having a superlattice structure. In a superlattice structure, a number of thin layers each having a thickness of several tens of Ångstroms are stacked with each other to form one-dimensional quantum wells. Thus, there are proposals to fabricate quantum wires by forming two-dimensionally confined structures in such a superlattice structure by means of a photolithographic patterning process that uses an electron beam exposure process. Further, one may form quantum boxes by forming three-dimensionally confined structures in such a superlattice structure. See, for example, P. M. Petroff et al., Applied Physics Letters, vol. 41, 1982, pp. 635–638, or H. Temkin et al., Applied Physics Letters, vol. 50, 1987, pp. 413–415.

In such conventional processes for forming quantum wires or quantum boxes directly by applying photolithographic or electron lithographic processes, however, there occurs a problem of damage or contamination in the part where the desired quantum structure is to be formed. Thereby, the electronic or optical properties of the obtained device is inevitably deteriorated.

In order to eliminate the problem of damaging to the quantum structure at the time of fabrication, there is a proposal to form such quantum structures by depositing crystal layers. For example, it is proposed to form an insulation film of $SiO_2$ or the like, on a single crystal semiconductor substrate, followed by a photolithographic patterning of the insulation film to form an insulation pattern. Thereby, the desired quantum wires or quantum boxes are formed by selectively growing semiconductor layers on such an insulation pattern by means of commonly used deposition process such as MOCVD process. See, for example, H. Asai, et al., Applied Physics Letters, vol. 51, 1987, pp. 1518–1520, or T. Fukui, et al., Applied Physics Letters, vol. 58, 1991, pp. 2018–2020.

Also, there are proposals to process a single crystal semiconductor substrate by means of a photolithographic process, followed by a deposition of semiconductor layers thereon by means of MBE (molecular beam epitaxy) or MOVPE (metal organic vapor phase epitaxy) process, to form the desired quantum wires or quantum boxes. In such an approach, a V-shaped groove is formed on a (100)-oriented surface of a III–V compound semiconductor substrate of GaAs or InP by using a $SiO_2$ mask, followed by epitaxial deposition of semiconductor layers. See, for example, Kapon, E., et al., Applied Physics Letters, vol. 50, 1987, pp. 347–349.

However, these conventional proposals have not reached the point of reduction to practice with respect to how to form the quantum wires or quantum boxes.

In view of these situations, the inventor has previously proposed, in the Japanese Patent Application 6-92576, filed Apr. 28, 1994, a simple process for forming a quantum structure such as a quantum box on a substrate.

According to the proposal of the inventor, a mask of predetermined shape, which may have a circular opening, is provided on a {111}B-oriented surface of a substrate having zinc blende structure, such as GaAs or InP, followed by an anisotropic wet etching process to form an etch pit of an inverted tetrahedral shape. Further, a semiconductor layer of a widegap material acting as a barrier layer and a semiconductor layer of a small bandgap material acting as a quantum well layer, are deposited thereon alternately to form a quantum structure in the etch pit. In such a structure, it should be noted that a three-dimensionally confined quantum box is formed at the bottom apex of the etch pit. By using the foregoing process, formation of quantum structures suitable for an electron device, is substantially facilitated.

On the other hand, the foregoing process has a drawback in that one cannot obtain a groove suitable for a device when the process is applied to a semiconductor substrate having a {111}A-orientated surface. Further, the conventional process has a problem in that the process for forming the quantum well inevitably involves a step for exposing the etch pit thus formed to the air during the wet etching process. Thereby, contamination of the etch pit by the contaminants in the air is inevitable. Furthermore, such a wet etching process interrupts a series of continuous chain of processes conducted in a vapor phase deposition apparatus. Thereby, the throughput of fabrication is deteriorated also. It should be noted that a wet etching process is accompanied by a cleaning process and a drying process that has to be conducted outside the deposition apparatus.

SUMMARY OF THE INVENTION

Accordingly, it is a general object of the present invention to provide a novel and useful fabrication process of a quantum semiconductor device, wherein the foregoing problems are eliminated.

Another and more specific object of the present invention is to provide a method for fabricating a quantum device including a quantum box therein, without exposing the device to the air.

Another object of the present invention is to provide a quantum semiconductor device, comprising:

a semiconductor substrate of zinc blende structure, defined by a principal surface substantially coinciding to a {111}A-oriented crystal surface;

an etch pit of the shape of a triangular pyramid, formed on said surface of said substrate, said etch pit being defined by side walls merging at an apex of said triangular pyramid, each two of said side walls merging at a valley of said triangular pyramid; and an active part formed on said etch pit;

said active part including a quantum well layer having a first bandgap and provided along said side walls of said etch pit, and a pair of barrier layers having a second, larger bandgap and provided so as to sandwich said quantum well layer.

According to the present invention, the quantum semiconductor device includes a quantum box at the apex of the triangular pyramid and quantum wires at the three valleys of the triangular pyramid, in addition to the one-dimensionally confined quantum wells formed by the quantum well layer in correspondence to each of the side walls of the triangular pyramid. By using the quantum box, quantum wires or quantum wells, the device of the present invention can perform various functions.

Another object of the present invention is to provide a method for fabricating a quantum semiconductor device, comprising the steps of:

forming an etch pit of the shape of a triangular pyramid on a principal surface of a semiconductor substrate having zinc blende structure, by applying an anisotropic dry etching process upon said principal surface, said principal surface being formed of a crystal surface substantially coinciding to a {111}A crystal surface;

depositing a barrier layer of a semiconductor material having a first bandgap upon said etch pit;

depositing a quantum well layer of a semiconductor material having a second, smaller bandgap upon said barrier layer; and depositing a barrier layer of a semiconductor material having a third bandgap larger than said second bandgap, upon said quantum well layer.

According to the present invention, it is possible to form the desired quantum structure including a quantum box and quantum wires by forming the etch pit of triangular pyramid on the surface of the substrate of zinc blende structure by an anisotropic dry etching process. Thereby, the formation of the etch pit can be achieved in the same deposition apparatus used for depositing the barrier layers and the quantum well layer, without taking out the substrate from the deposition apparatus for a wet etching process. Thereby, the chance that the etch pit is contaminated is substantially eliminated. Further, the throughput of production of the device is improved substantially.

Other objects and further features of the present invention will become apparent from the following detailed description when read in conjunction with the attached drawings.

DETAILED DESCRIPTION OF THE PREFERRED EMBODIMENTS

Figure 1A:
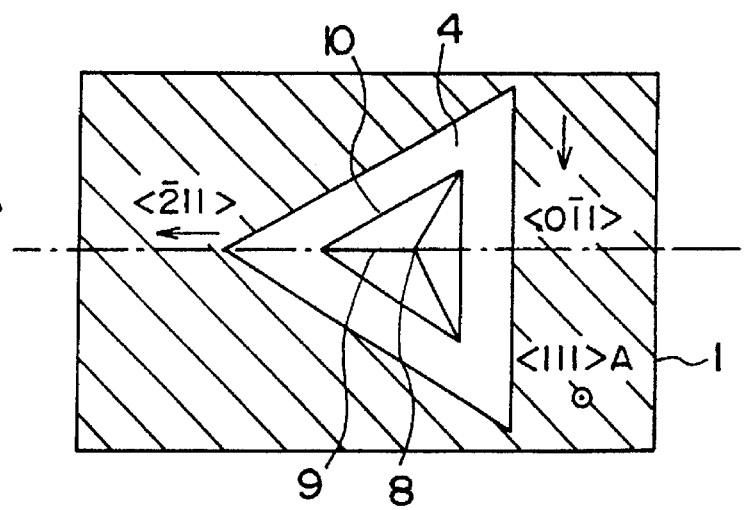
FIGS. 1A and 1B are diagrams showing the principle of the present invention.
Figure 1B:
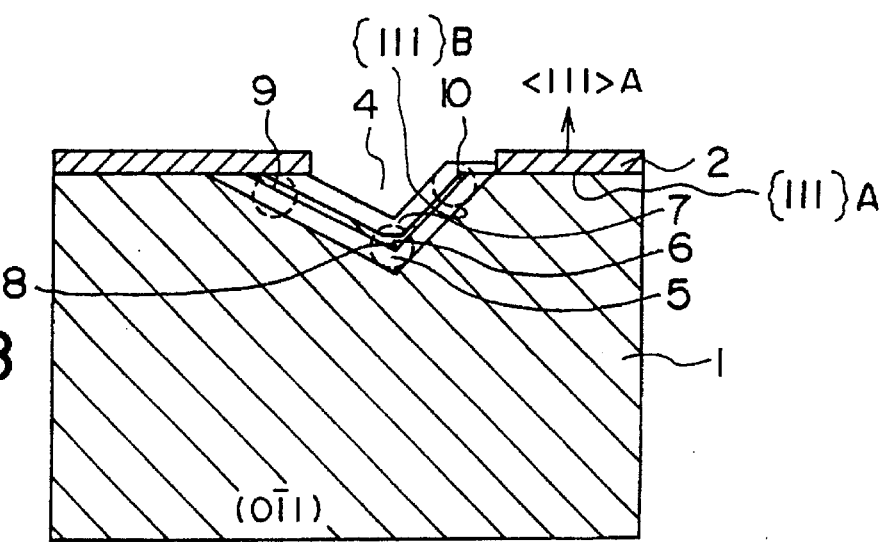

FIGS. 1A and 1B show the principle of the present invention, wherein FIG. 1A shows a quantum structure formed on a semiconductor substrate in a plan view, while FIG. 1B shows the quantum structure of FIG. 1A in a cross sectional view taken along a one-dotted chain A-A', which coincides with a <$\bar{2}11$> direction.

Referring to the drawings, an etch pit 4 of a flat tetrahedral shape or triangular pyramid shape is formed on a {111}A-oriented surface of a semiconductor substrate 1 of InP or GaAs that has zinc blende structure, by applying an anisotropic dry etching process upon the substrate while protecting the {111}A-oriented surface by a mask having a circular opening. In a typical example, the dry etching process is achieved with a condition set such that the etching rate for the {110}-oriented surface is substantially smaller than the etching rate for other crystal surfaces. As a result, the etch pit 4 is defined by side walls formed of the {110}-oriented surface, wherein the {110}-oriented side walls are inclined with respect to the {111}A-oriented surface by 35.3°. In the plan view of FIG. 1A, it will be noted that the etch pit 4 shows a triangular shape having a base edge extending in a <$0\bar{1}1$> direction. As is commonly practiced in the art, the {111}A surface indicates the surface equivalent to the (111)A surface and exposing the group III atoms.

On the etch pit 4, a quantum structure is formed such that the quantum structure includes a quantum well layer 6 of a small bandgap sandwiched by barrier layers 5 and 7 having larger bandgaps. It should be noted that the quantum structure includes quantum wires 9 formed along the valleys of the triangular pyramid and a quantum box 8 formed at the apex of the triangular pyramid, in addition to ordinary, one-dimensionally confined quantum wells 10 formed along the {110}-oriented side walls. By forming an active part on such a quantum structure, it is possible to obtain a quantum semiconductor device that relies upon the quantum mechanical effect taking place in such a quantum structure.

Further, by changing the condition of dry etching, it is possible to form the etch pit 4 defined by different crystal surfaces such as, {111}B- or {11$\bar{1}$}-B surfaces.

Next, a first embodiment of the present invention will be described with reference to FIGS. 2A–2C.

Figure 2A:
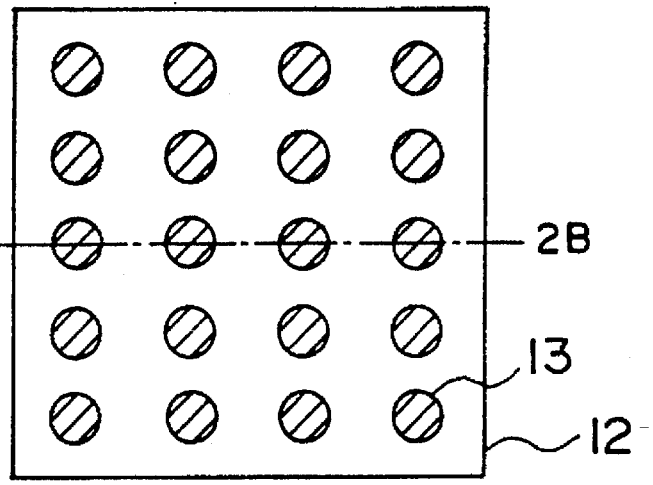
FIGS. 2A–2C are diagrams showing the fabrication process of a quantum semiconductor device according to a first embodiment of the present invention.
Figure 2B:
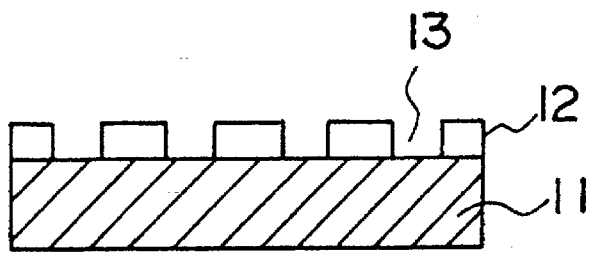

Referring to FIGS. 2A and 2B showing a substrate 11 of InP defined by a (111)A-oriented surface respectively in a plan view and in a cross sectional view, an insulation film 12 of SiO$_2$ is deposited on the (111)A-oriented surface by a CVD process with a thickness of 100 nm, followed by a patterning process of the same to form a circular opening 13 having a diameter of 1 μm by an ordinary photolithographic patterning process. The substrate 11 may have a thickness of 400 μm.

Next, the substrate 11 thus carrying thereon the SiO$_2$ mask 12 is incorporated into a reaction chamber of a vertical type deposition apparatus designed for reduced MOVPE processes, and a dry etching process is conducted therein at 500° C. while supplying a HCl gas diluted by $H_2$ to a concentration level of 1% with a flowrate of 100 sccm, together with a $PH_3$ gas diluted by $H_2$ to a concentration level of 10% and further with a carrier gas of $H_2$, wherein the flowrate of the $PH_3$ gas is set to 50 sccm while the flowrate of the carrier gas is set such that the total flowrate of $H_2$ into the reaction chamber is set to 2000 sccm and such that the pressure inside the reaction chamber is held at 50 Torr.

Figure 2C:
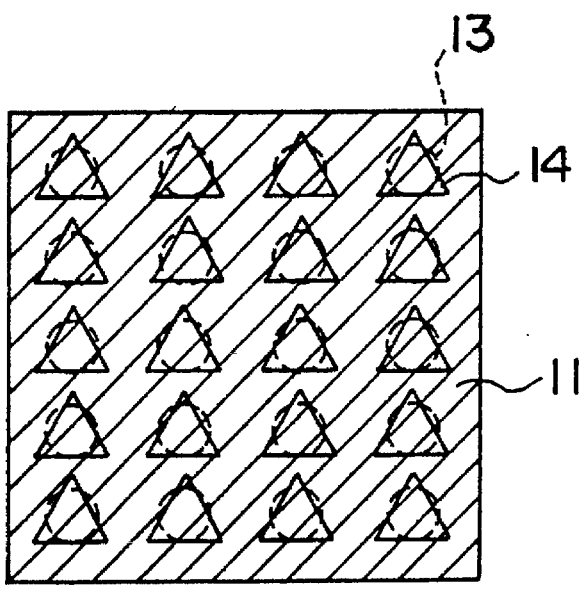

As a result of the dry etching, etch pits 14 of the shape of a triangular pyramid are formed in the substrate 11 in correspondence to the openings 13 as indicated in FIG. 2C.

Referring to FIG. 2C, it will be noted that the each etch pit 14 forms a triangle that circumscribes the circular window 13 when viewed in the plan view, and thus, the size of the etch pit 14 is determined generally by the size of the window 13. Further, the etch pits 14 are aligned in the same orientation because of the fact that the {110} surfaces forming the side walls of the etch pit 14 have respective, predetermined crystal orientation with respect to the (111)A surface.

It should be noted that the $PH_3$ gas is introduced in the dry etching process in order to prevent the loss of P associated with the thermal dissociation of the InP substrate 11. Further, $PH_3$ suppresses the etching caused by HCl. Thus, by controlling the flowrate of the $PH_3$ gas, it is possible to control the etching rate when forming the etch pits 14.

Figure 3A:
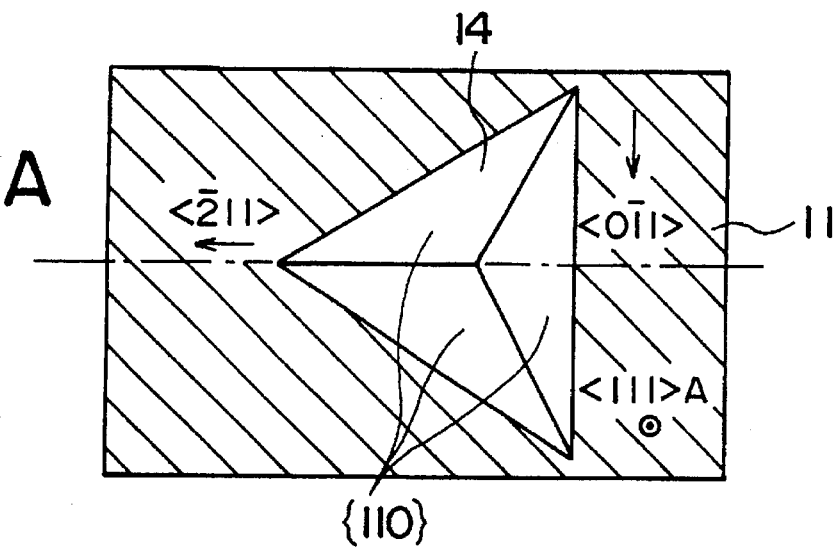
FIGS. 3A and 3B are diagrams showing the etch pit formed in the process of FIGS. 2A–2C in detail.
Figure 3B:
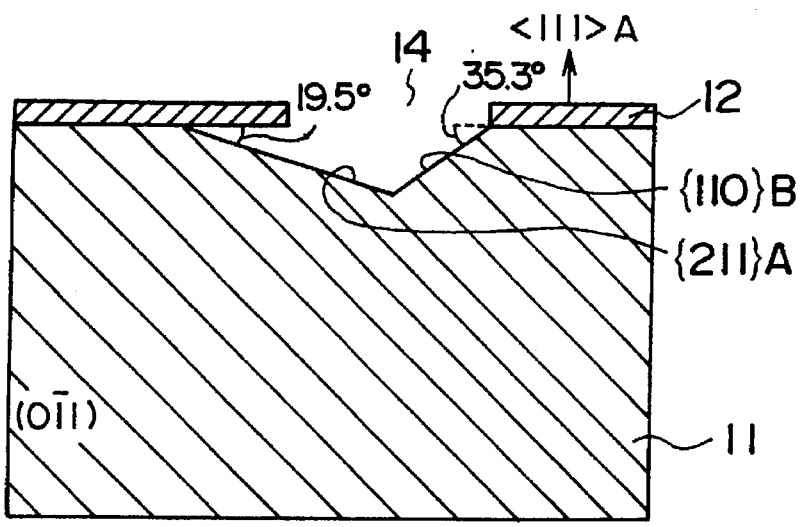

FIGS. 3A and 3B show the etch pit 14 in detail, wherein FIG. 3A shows the etch pit 14 in an enlarged plan view, while FIG. 3B shows the etch pit 14 of FIG. 3A in a cross sectional view taken along a line A-A' in FIG. 3A.

Referring to the drawings, the etch pit 14 is defined by three side walls each forming a {110} surface, wherein each of the side walls intersects with the (111)A surface of the substrate 11 with an angle of 35.3°. Further, two side walls intersect with each other at a valley of the etch pit 14, and the valley in turn intersects the (111)A surface of the substrate 11 with an angle of 19.5°.

It should be noted that such a pit 14 defined by the {110}-oriented side walls is formed by an anisotropic dry etching process applied to the (111)A-oriented surface of the InP substrate 11, wherein the etching condition is set such that the etching rate is substantially reduced at the {110} surfaces as compared with other crystal surfaces. Thus, once the {110}-oriented side walls develop so as to surround the circular mask opening 13, the etching does not proceed any further, and the growth of the etch pit 14 substantially stops. Thereby, the etch pit 14 is maintained at the size corresponding to the size of the opening 13 in which the triangular base area of the triangular pyramid circumscribes the circular opening 13 of the mask 12.

The microscopic observation of the etch pit 14 conducted by a high resolution scanning electron microscope (SEM) revealed that the three valleys of the triangular pyramid and hence the three {110}-oriented side walls merge exactly at the apex of the triangular pyramid. No flat bottom surface was observed at the bottom apex of the triangular pyramid even by the observation made by a powerful SEM.

Figure 4A:
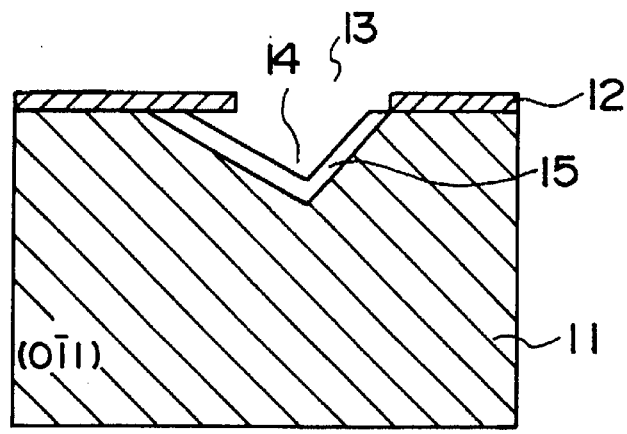
FIGS. 4A–4C are diagrams showing the process for forming a quantum structure on the etch pit according to the first embodiment of the present invention.

After the etch pits 14 are formed on the substrate 11 as such, the substrate 11 is left in the reaction chamber of the deposition apparatus, and TMIn (trimethylindium) diluted by $H_2$ is supplied as a source gas of In with a flowrate of 100 sccm while maintaining the temperature at 600° C., together with phosphine ($PH_3$) diluted by $H_2$ to 10%, wherein phosphine is supplied as a source gas of P with a flowrate of 100 sccm. Further, a high purity $H_2$ gas is supplied as a carrier gas with a flowrate adjusted such that the total flowrate of $H_2$ in the reaction chamber becomes 2000 sccm, and a barrier layer 15 of InP is deposited on the {110} side walls of the etch pit 14 with a thickness of 500 Å as indicated in FIG. 4A.

In the deposition of the InP layer, the vessel containing TMIn is held at a temperature of 13.5° C. such that the vapor pressure of TMIn is set to 1 Torr. During the deposition, the pressure inside the reaction chamber is held at 50 Torr.

Figure 4B:
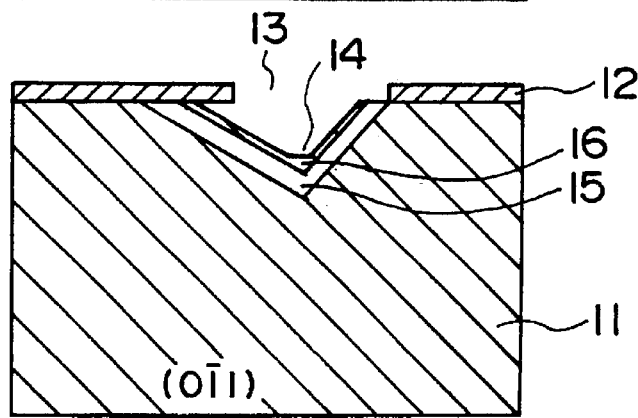

Next, in the step of FIG. 4B, the vessel holding TMIn at 13.5° C. is supplied with a carrier gas of $H_2$ with a flowrate of 200 sccm, and TMIn therein is supplied to the reaction chamber of the deposition apparatus as a source gas of In. Simultaneously, a carrier gas of $H_2$ is supplied to the vessel that holds TMGa (trimethylgallium) at −10.0° C., with a flowrate of 5 sccm, and TMGa therein is supplied also to the deposition chamber as a source gas of Ga. Further, arsine ($ASH_3$) diluted by $H_2$ to 10% is supplied with a flowrate of 100 sccm. In addition, the carrier gas of $H_2$ is supplied with a flowrate set such that the total flowrate of $H_2$ supplied to the reaction chamber becomes 2000 sccm. Thereby, a quantum well layer 16 of InGaAs is deposited with a thickness of 50 Å at the bottom of the etch pit that corresponds to the apex of the triangular pyramid as indicated in FIG. 4B.

Next, a carrier gas of $H_2$ is supplied to the vessel that holds TMIn at 13.5° C. with a flowrate of 100 sccm, and TMIn therein is supplied to the reaction chamber together with the carrier gas. Simultaneously, a carrier gas of $H_2$ is supplied to the vessel that holds $PH_3$ diluted by $H_2$ to the 10% concentration level, with a flowrate of 100 sccm, and $PH_3$ therein is supplied to the reaction chamber together with the carrier gas as the source of P, wherein the total flowrate of $H_2$ in the deposition chamber is set to 2000 sccm. As a result, a barrier layer 17 of InP is grown with a thickness of 500 Å.

In the foregoing description, it should be noted that the thicknesses of the layers 15–17 are estimated based upon the thicknesses of the corresponding layers that are grown on a flat, (111)A-oriented surface of a reference substrate where no etch pit is formed.

As a result, a quantum box 18 is formed in correspondence to the part of the InGaAs well layer 16 where the layer 16 is three-dimensionally confined by the InP barrier layers 15 and 17. The quantum box 18 thus formed can be used for the active part of a light emitting device such as laser diode or light emitting diode as well as for a memory device that uses quantum levels for storing information.

In the formation of the quantum box 18, it should be noted that the barrier layer 15 grows in conformity with the {110}-oriented side walls forming the etch pit 14 due to the preferential deposition of InP on the {110}surface, while the deposition rate of InGaAs forming the quantum well layer 16 is less pronounced on the {111}B surface. Thereby, the quantum well layer 16 shows a flat bottom surface at the bottom apex of the etch pit 14. The flat bottom surface may be formed of a crystal surface close to the (111)A surface.

Associated with the formation of the quantum box 18, quantum wires 19 are formed along the valleys of the etch pit 14. The quantum wires 19 are defined by a crystal surface close to the {211}A surface.

In such a structure, ordinary, one-dimensionally confined quantum wells 20 are formed in correspondence to the {110}-oriented side walls of the etch pit 14, while it is possible to form the quantum wells 10 such that they do not affect on the operation of the quantum device, by reducing the thickness of the InGaAs layer 16 on the {110}-oriented side walls. In fact, it is possible to form the quantum device such that the device substantially includes the quantum box 18 alone in the active part thereof, by reducing the thickness of the InGaAs well layer 16 sufficiently. By doing so, it should be noted that the quantum wells 20 or the quantum wires 19 have quantum levels substantially different from the quantum levels for the quantum box 18.

In the foregoing process for forming the etch pit 14, it should be noted that no satisfactory result is obtained when a GaAs or InP crystal having a {111}B-oriented surface is used for the substrate 11. In such a case where {111}A-oriented surfaces appear at the side walls of the etch pit 14, the etching rate for forming the etch pit increase substantially at the {111}A-oriented side walls, and the etching proceeds under the $SiO_2$ mask 12 beyond the mask opening 13. In other words, the etch pit thus formed does not form a circumscribing triangle at the substrate surface, and the depth of the etch pit is no longer controllable.

In the present embodiment, it is also possible to form the etch pit 14 to have a right tetrahedral shape defined by {111}-B or {11$\bar{1}$}oriented side walls, depending upon the etching condition as noted previously. In this case, the side walls form an angle of 70.5° with respect to the {111}-A oriented upper major surface, and the valley formed by two such side walls intersects the (111)A surface with an angle of 54.7°.

Next, a semiconductor device that employs the quantum structure formed on the etch pit 14 will be described as a second embodiment of the present invention.

Figure 5:
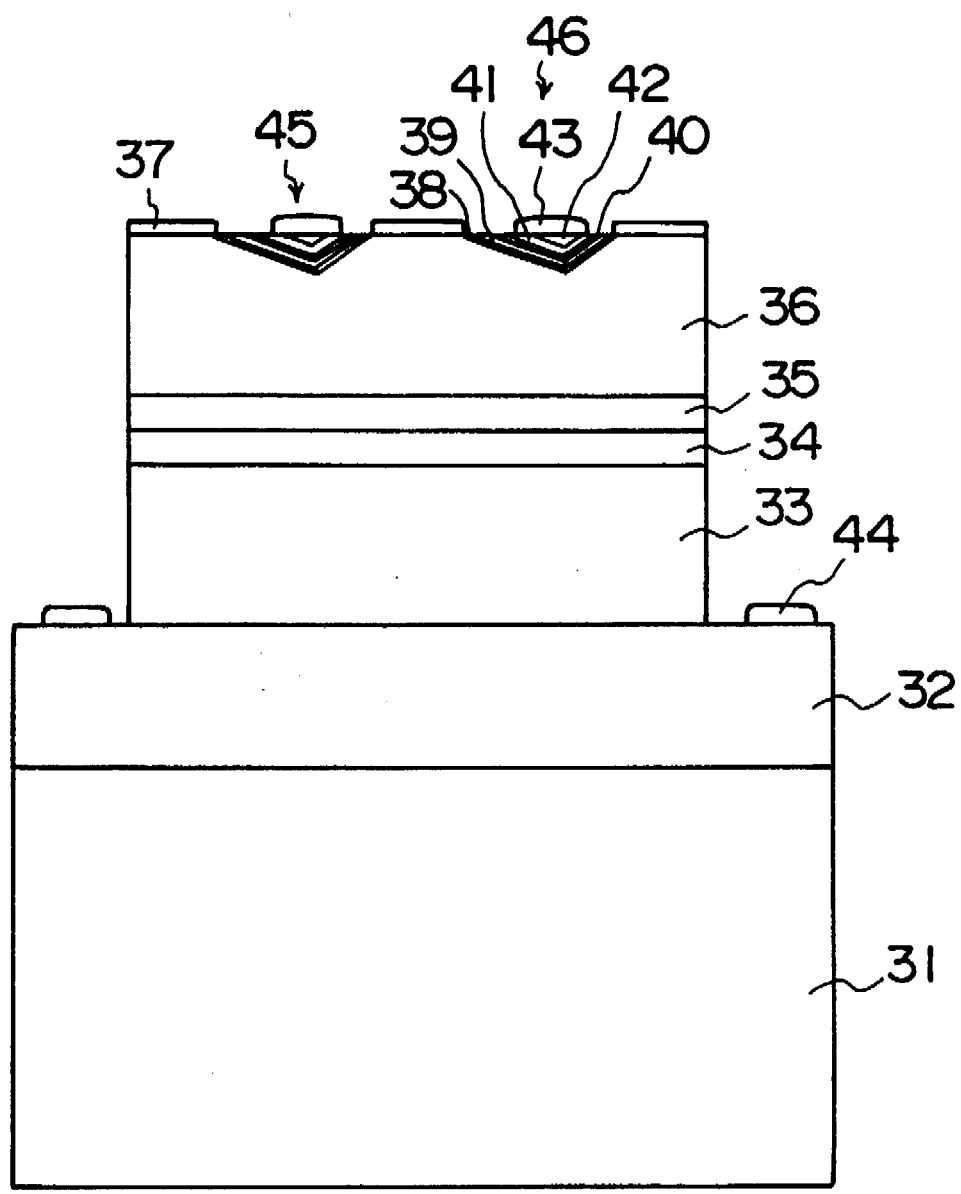
FIG. 5 is a diagram showing the construction of a dual-emitter RHET according to a second embodiment of the present invention.

Referring to FIG. 5, the semiconductor device is a double-emitter RHET (resonant-tunneling hot electron transistor) constructed upon a (111)A-oriented surface of a semi-insulating substrate 31 of InP on which a collector contact layer 32 of $n^+$-type InGaAs is formed with a thickness of 200 nm. On the collector contact layer 32, a collector layer 33 of n-type InGaAs is formed with a thickness of 200 nm, wherein the collector layer 33 forms a mesa structure exposing the surface of the collector contact layer 32.

On the collector layer 32, a barrier layer 34 of undoped InP is formed with a thickness of 50–100 nm, and a base layer 35 of n-type InGaAs is formed on the barrier layer 34 with a thickness of 50 nm. Further, a semi-insulating InP layer 36 doped by Fe is deposited on the base layer 35, wherein the InP layer 36 has a (111)A surface similar to the substrate 11 described previously and is formed with etch pits 45 and 46 of a triangular pyramid shape defined by {110}-oriented side walls similarly to the etch pits 14.

Each of the etch pits 45 and 46 forms an emitter region and includes a quantum structure formed of a quantum well layer 39 of undoped InGaAs sandwiched by lower and upper barrier layers 38 and 40 both of undoped InP, similarly to the quantum structure formed on the etch pits 14. On the upper barrier layer 40, an emitter layer 41 of n-type InGaAs is provided so as to fill the depression, and an emitter contact layer 42 of $n^+$-type InGaAs is further provided on the emitter layer 41.

On the emitter contact layer 42, an emitter electrode 43 is provided in ohmic contact therewith. Further, a collector electrode 44 is provided on the exposed upper major surface of the collector contact layer 32.

In such a double-emitter RHET, it is possible to eliminate the base electrode by providing a second emitter structure such as the emitter structure 46 and a corresponding second emitter electrode, in addition to the first emitter structure 45 and a corresponding first emitter electrode. Thereby, the difficulty, encountered in conventional RHETs, of providing a base electrode in ohmic contact with an extremely thin base layer is successfully avoided, and the fabrication of the device is substantially facilitated.

Figure 6:
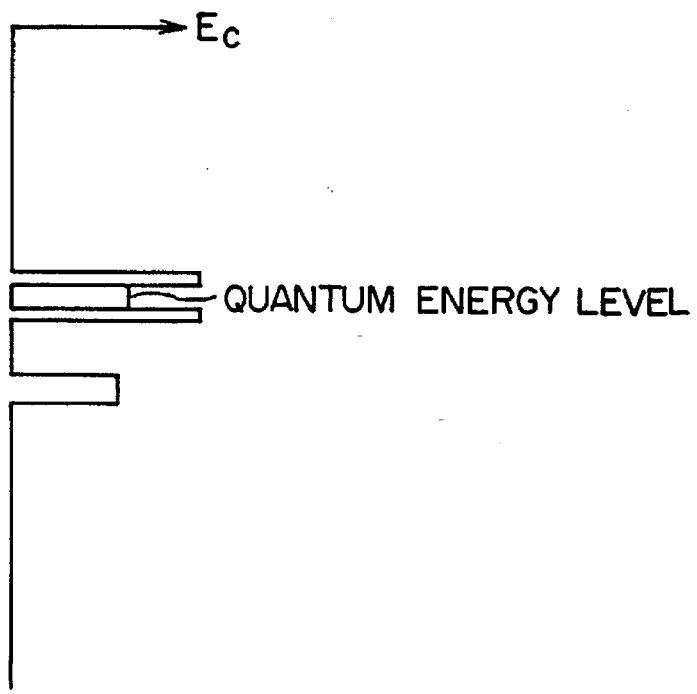
FIG. 6 is a diagram showing the band structure of the quantum box formed in the device of FIG. 5.

FIG. 6 shows the band structure of the quantum box formed in any of the emitter structures 45 and 46. It will be noted that such a structure forms a quantum level in correspondence to the quantum well layer 39 sandwiched by potential barriers formed by the barrier layers 38 and 40. Thereby, the hot electrons of a predetermined, selected energy level corresponding to the quantum level, are injected selectively from the emitter structure 45 or 46 to the base layer 35. Because of the three-dimensional confinement of the carriers in the quantum box, a sharply defined, delta function-like energy spectrum appears in the hot electrons injected to the base layer 35, and the switching operation of the transistor occurs with a sharply defined threshold characteristic. Such a double-emitter RHET can be used for constructing a static random access memory as disclosed in the U.S. Pat. No. 5,311,465, which is incorporated herein as reference.

In summary, it is possible to control the deposition mode of the InGaAs layer 16 on the etch pit 14 by controlling the deposition temperature and the supply rate of the As atoms and hence the flowrate of the As source gas. As a result of control of the growth mode of the InGaAs layer 16, it is possible to form any of the quantum box 18, quantum wires 19 and the one-dimensionally confined quantum wells 20 as desired.

It should be noted that the above explanation applies not only to the deposition of the InGaAs layer 16 but also to the deposition of a GaAs layer or any other III–V semiconductor layer that contains As as the group V element. Further, such an art of the selective formation of the quantum box, quantum wires or one-dimensionally confined quantum wells, is applicable also to the case of using other III–V semiconductor material such as InP or a group II–VI semiconductor material having zinc blende structure.

It should be noted that the quantum wires 19 and one-dimensionally confined quantum wells 20 thus formed are also expected to form a useful electron device or optical device, similarly to the quantum box 18. Particularly, the one-dimensionally confined quantum well layers 20 formed in the etch pit 14 may be used to form a light emitting device in which the optical beam, emitted by the inclined quantum well layer 20, is reflected by the opposing inclined side walls of the etch pit 14 in the direction perpendicular to the upper major surface of the substrate 11.

Further, it is possible to construct a quantum device in which the quantum box 18 at the bottom apex of the etch pit 14 and the quantum wires 19 along the valleys of the etch pit 14 cooperate with each other. In such a device, for example, the electrons in one of the quantum wires 19 reach another quantum wire 19 via the quantum box 18 at the bottom apex of the etch pit 14, with a controlled rate of transmission through the quantum box 18.

Further, a large number of quantum devices, such as the one described with reference to FIG. 5, may be formed on a common substrate to form an integrated circuit.

Figure 4C:
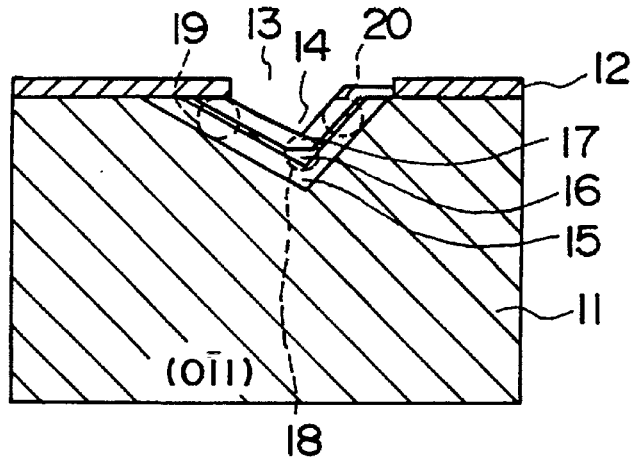
Figure 7:
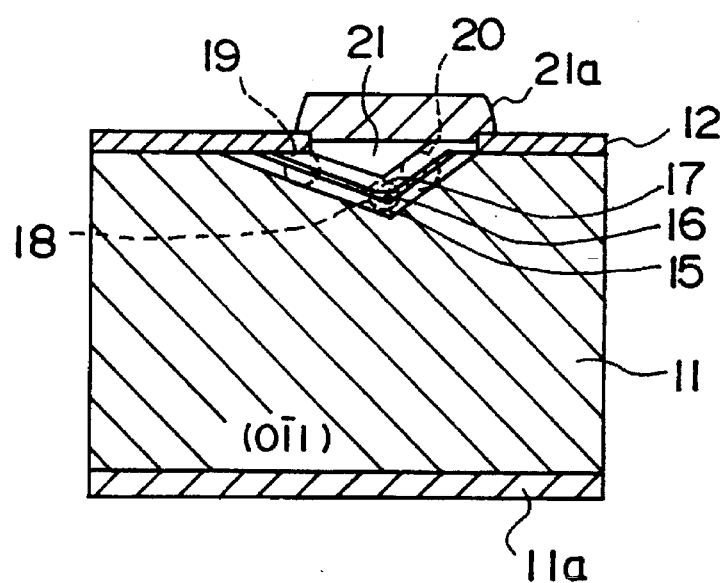
FIG. 7 is a diagram showing the construction of a light emitting device according to another embodiment of the present invention.

It is also possible to use a doped semiconductor material for the substrate 11 in the structure of FIG. 4C to form an optical semiconductor device such as a light emitting diode. In such a case, one may form a p-i-n junction at the quantum structure, by doping the substrate 11 and the barrier layer 15 to the n-type and further by doping the barrier layer 17 to the p-type, while using undoped InGaAs for the quantum well layer 16. Alternatively, one may dope the substrate 11 and the barrier layer 15 to the p-type and the barrier layer 17 to the n-type. In any of these cases, the barrier layers 15 and 17 serve for the cladding layer while the quantum well layer 16 serves for the active layer of a light emitting device, and the light emitting device typically includes an electrode 11a provided on the bottom surface of the substrate 11 and a second electrode 21a provided on a semiconductor layer 21 filling the depression formed on the barrier layer 17 as indicated in FIG. 7, which shows a fourth embodiment of the present invention. The semiconductor layer 21 is doped to the same conductivity type as the barrier layer 17. Further, one may form a quantum device by depositing the layers 15–17 of the same composition but with different conductivity types.

In the description heretofore, it has been assumed that the substrate 11 has a (111)A-oriented upper major surface. However, the present invention is by no means limited to such a particular crystal surface of the substrate 11, but any crystal surface equivalent to the (111)A surface, i.e., a surface designated by {111}A, may be used for forming the etch pit 14 on which a quantum semiconductor device is to be provided. Further, any crystal surface inclined with respect to the {111}A surface within an offset angle of 10° may be used as the surface for forming the etch pit 14.

Further, the opening 13 of the etching mask 12 is not limited to be circular. An opening having a different shape may also be used, although it is preferable to form such a mask opening to have a shape close to a circular shape in order to obtain a triangular pyramidal shape for the etch pit 14.

In the deposition of the epitaxial layers 15–17, one may use deposition process other than the reduced pressure MOVPE process described previously. Such deposition process includes MBE process, ALE (atomic layer epitaxy) process, CBE (chemical beam epitaxy) process, GSMBE (gas source molecular beam epitaxy) process, MOMBE (metal organic molecular beam epitaxy) process, chloride VPE process, hydride VPE process and LPE (liquid phase epitaxy) process. The deposition of the insulation mask 12 or the electrode may be achieved by CVD process, sputtering process or evaporation deposition process.

It should further be noted that the dry etching process used for forming the etch pit of triangular pyramid shape is not limited to the one that uses HCl for the etching gas. One may use other gaseous material that contains Cl, such as $CCl_4$, $CH_3Cl$, $C_2H_5Cl$, and the like, for the etching gas. Alternatively, the etching gas may be the one that contains halogen other than Cl, such as F, Br or I. The etching gas in this case includes $CF_4$, $CBr_4$, $CH_3$, and the like.

The size of the opening 13 formed on the $SiO_2$ mask 12 is by no means limited to 1 μm as described previously in the first embodiment, but can be selected arbitrarily from a range from 1–10 μm according to the needs. It is also possible to form the mask opening 13 to have a size of 100 Å–1 μm by employing an electron beam exposure process. By forming such minute mask openings 13, the quantum structures on the substrate are miniaturized and the integration density of the semiconductor devices on the substrate increases substantially. Further, the material forming the mask 12 is by no means limited to $SiO_2$ but one may use SiON or SiN without problem. Further, one may use a conductive material such as W, WSi, Al, and the like, for the mask layer 12. Alternatively, it is even possible to use a semiconductor material for the mask 12 as long as the semiconductor material shows selectivity in the etching applied to the substrate 11. When InP is used for the substrate 11, the etching mask 12 may be formed of InGaAsP. By using such a semiconductor etching mask, grown epitaxially on the substrate, it is possible to improve the adherence of the mask 12 upon the substrate 11, and the control of the etch pit size is improved accordingly.

In the embodiment of FIGS. 4A–4C or FIG. 7 described heretofore, the deposition of the semiconductor layers 15–17 on the etch pit 14 has been conducted while leaving the etching mask 12 on the substrate 11. By doing so, it is possible to achieve a self-aligned contact of the electrode at the mask opening as indicated in FIG. 7.

However, it is also possible to conduct the deposition of the semiconductor layers 15–17 in the state that the etching mask 12 is removed. Such a deposition process, conducted in the state that the etching mask 12 is removed, is particularly suitable for depositing semiconductor layers by means of the MBE process where the mask 12 tends to cause shadow in the molecular beams. When the deposition of the layers 15–17 is made without the mask 12, the deposition of the semiconductor layers occurs also on the (111)A-oriented upper major surface of the substrate 11. Thus, one may be able to form a semiconductor device acting as a peripheral circuit cooperating with the quantum semiconductor device, on such semiconductor layers deposited on the (111)A-oriented surface of the substrate 11.

Further, it should be noted that the substrate 11 carrying the quantum semiconductor device is by no means limited to InP, but other semiconductor materials having zinc blende structure may also be used. For example, it is confirmed that GaAs may be used for the substrate 11, with a similar result. By using GaAs for the substrate 11, the under etching can be reduced as compared with the case in which InP is used for the substrate. Further, other binary, ternary or quarternary compound semiconductor materials including epitaxially grown layers of AlGaAs, InGaAs, InAlAs, InGaP, AlGaP, AlGaAsP, InGaAlP, InGaAlAs and InGaAsP may be used for the substrate 11. Further, one may use II–VI compound semiconductor materials for the substrate 11 as long as they have zinc blende structure.

Further, the present invention is not limited to the embodiments described heretofore, but various variations and modifications may be made without departing from the scope of the invention.

What is claimed is:

1. A semiconductor device, comprising:

a semiconductor substrate of zinc blende structure, defined by a principal surface substantially coinciding to a {111}A-oriented crystal surface;

an etch pit of the shape of a triangular pyramid, formed on said principal surface of said substrate, said etch pit being defined by side walls merging at an apex of said triangular pyramid, each two of said side walls merging at a valley of said triangular pyramid; and an active part formed on said etch pit;

said active part including a quantum well layer having a first bandgap and provided along said side walls of said etch pit, and a pair of barrier layers having a second, larger bandgap and provided so as to sandwich said quantum well layer.

2. A semiconductor device as claimed in claim 1, wherein said etch pit is defined by side walls formed of {110}-oriented crystal surfaces.

3. A semiconductor device as claimed in claim 1, wherein said etch pit is defined by side walls formed of {111}B-oriented crystal surfaces.

4. A semiconductor device as claimed in claim 1, wherein said quantum well layer forms a quantum box in correspondence to said apex of said etch pit.

5. A semiconductor device as claimed in claim 1, wherein said quantum well layer forms a quantum wire in correspondence to each of said valleys of said etch pit.

6. A semiconductor device as claimed in claim 1, wherein said quantum well layer forms a one-dimensionally confined quantum well in correspondence to each side wall of said etch pit.

7. A semiconductor device as claimed in claim 1, wherein each of said quantum well layer and said barrier layer is formed of a semiconductor crystal having zinc blende structure.

8. A semiconductor device as claimed in claim 1, wherein said principal surface of said substrate is inclined with respect to said {111}A surface within an offset angle of 10°.

* * * * *